(12) United States Patent
Ihara et al.

(10) Patent No.: US 7,335,283 B2
(45) Date of Patent: Feb. 26, 2008

(54) PRODUCTION METHOD FOR COMPOSITE OXIDE THIN FILM AND DEVICE THEREFOR AND COMPOSITE OXIDE FILM PRODUCED THEREBY

(75) Inventors: Hideo Ihara, deceased, late of Tsukuba (JP); by Yoshiko Ihara, legal representative, Tsukuba (JP); by Hideyo Ihara, legal representative, Tokyo (JP); by Hidetaka Ihara, legal representative, Tokyo (JP); by Gen-ei Ihara, legal representative, Takamatsu (JP); by Chiaki Ihara, legal representative, Tokyo (JP); Sundaresan Athinarayanan, Tsukuba (JP); JiaCai Nie, Tsukuba (JP)

(73) Assignees: Japan Science and Technology Corporation, Saitama (JP); National Institute of Advanced Industrial Science and Technology, Tokyo (JP)

( * ) Notice: Subject to any disclaimer, the term of this patent is extended or adjusted under 35 U.S.C. 154(b) by 332 days.

(21) Appl. No.: 10/363,050
(22) PCT Filed: Aug. 24, 2001
(86) PCT No.: PCT/JP01/07280

§ 371 (c)(1),
(2), (4) Date: Nov. 20, 2003

(87) PCT Pub. No.: WO02/20879

PCT Pub. Date: Mar. 14, 2002

(65) Prior Publication Data

US 2004/0127064 A1 Jul. 1, 2004

(51) Int. Cl.
C23C 14/00 (2006.01)
(52) U.S. Cl. .................. 204/192.24; 505/100
(58) Field of Classification Search ............. 204/192.1, 204/192.12, 192.15, 298.02, 298.01, 192.24; 505/100, 125, 475

See application file for complete search history.

(56) References Cited

U.S. PATENT DOCUMENTS 4,923,585 A * 5/1990 Krauss et al. .......... 204/298.04

(Continued)

FOREIGN PATENT DOCUMENTS

JP 5-279192 10/1993

(Continued)

OTHER PUBLICATIONS

Hideo Ihara et al.; Denshi Gijutsu Sougou Kenkyuusho Ihou, vol. 63, Nos. 1 & 2, pp. 67-75 and 72, Mar. 20, 1999. Cited in the int'l. search report.

(Continued)

*Primary Examiner*—Nam Nguyen
*Assistant Examiner*—Luan V. Van
(74) *Attorney, Agent, or Firm*—Westerman, Hattori, Daniels & Adrian, LLP.

(57) ABSTRACT

A method and an apparatus which permits making a composite oxide thin film excellent in crystallinity easily and at a low temperature, with the capability of controlling the basic unit cell structure as desired, and without the need for a post annealing, as well as a composite oxide thin film thereby, especially a Cu group high temperature superconducting thin film, are disclosed. A thin Cu group high temperature superconducting film, which is constituted of a charge supply block (1) and a superconducting block (2), is formed on a substrate by alternately sputtering from a sputtering target having a composition of the charge supply block (1) and a sputtering target having a composition of the superconducting block (2) and repeating such an alternate sputtering operation a number of times needed for the film to reach a desired thickness. The first sputtering target for the charge supply block has a charge supply block composition in which Cu atoms are partly substituted with atoms of an element having a structure stabilizing effect.

3 Claims, 12 Drawing Sheets

Cu-1223    Cu-1234    Cu-1245

Models of Crystallographic Structures of
Cu Group Superconductors (n=3∼5)

U.S. PATENT DOCUMENTS

| | | | | |
|---|---|---|---|---|
| 4,963,524 | A | * | 10/1990 | Yamazaki .................. 505/400 |
| 4,965,248 | A | * | 10/1990 | Poppe et al. ................ 505/475 |
| 4,994,435 | A | * | 2/1991 | Shiga et al. ................ 505/232 |
| 5,028,583 | A | * | 7/1991 | Tanaka et al. .............. 505/238 |
| 5,132,280 | A | * | 7/1992 | Fiory et al. ................. 505/413 |
| 5,151,408 | A | * | 9/1992 | Tanaka et al. .............. 505/476 |
| 5,252,553 | A | * | 10/1993 | Nakanishi et al. .......... 505/475 |
| 5,422,338 | A | * | 6/1995 | Watanabe .................. 505/329 |
| 5,629,267 | A | * | 5/1997 | Ikegawa et al. ............ 505/238 |
| 6,183,552 | B1 | * | 2/2001 | Sakai et al. .................... 117/3 |
| 6,444,620 | B2 | * | 9/2002 | Ihara ......................... 505/125 |

FOREIGN PATENT DOCUMENTS

| | | |
|---|---|---|
| JP | 10-236821 | 9/1998 |
| JP | 11-278996 | 10/1999 |
| JP | 2000-86388 | 3/2000 |

OTHER PUBLICATIONS

M. Alexe et al.; Applied Physics Letters, vol. 73, No. 11, pp. 1592-1594, Sep. 14, 1998. Cited in the int'l. search report.

* cited by examiner

Models of Crystallographic Structures of
Cu Group Superconductors (n=3~5)

PRODUCTION METHOD FOR COMPOSITE OXIDE THIN FILM AND DEVICE THEREFOR AND COMPOSITE OXIDE FILM PRODUCED THEREBY

TECHNICAL FIELD

The present invention relates to a method of and an apparatus for making a composite oxide thin film as well as a composite oxide thin film made by the method.

BACKGROUND ART

In late years, attention has be riveted to composite oxide materials as ferroelectric materials, oxide magnetic materials, oxide semiconductor materials, nonlinear optical materials, insulating materials, transparent electrode materials, low dielectric materials and oxide superconducting materials. Such a composite oxide material is comprised of various blocks having different in composition, lattice constant or crystallographic structure, layered one on top of another. This structural peculiarity has made it difficult to make up a composite oxide material satisfactory in crystallinity with the block epitaxially grown one on top of another.

A Cu group superconducting material that has attracted attention as an oxide superconducting material has a crystallographic structure in which a charge supply block and a superconducting block are formed one on top of another so as to be oriented in a direction of the crystallographic c-axis. Realizing a Cu group superconducting material excellent in superconducting properties requires realizing a crystallographic structure that is excellent in the c-axial orientation of both a charge supply and a superconducting block. However, large lattice mismatch between the charge supply and superconducting block makes it difficult to cause these block to grow epitaxially one on top of another. Indeed, it has been believed difficult to cause those blocks to so grow epitaxially by any method other than high-pressure synthesis and post annealing in Tl vapor.

Manufacturing a Cu group superconducting material by high pressure synthesis or Tl or Hg post annealing, however, has presented such problems as being costly, making it hard to yield thin films large in area, inadequacy for volume production and also toxicological problems. Further, it has entailed difficulties in controlling the basic unit cell structure as desired to make the material reproducibly and has required a high temperature and long term post annealing heat treatment in an oxidizing or reducing atmosphere for the material made. Moreover, the need for a high temperature in the process of manufacture has required the crystalline substrate on which a thin crystalline film satisfactory in the c-axial orientation is to be formed to be only a limited material that can withstand the high temperature.

These problems in the prior art mentioned as for Cu group superconducting materials commonly apply to composite oxide materials in general.

With the aforementioned problems born in mind, it is accordingly an object of the present invention to provide a method and an apparatus which permit making a thin film of composite oxide with satisfactory crystallinity easily and at a low temperature, with the capability of controlling the basic unit cell structure as desired, without necessitating either high temperature or high pressure and without the need for a post annealing. It is also an object of the present invention to provide a thin film of composite oxide made by such a method or an apparatus.

DISCLOSURE OF THE INVENTION

In order to attain the objects mentioned above, there is provided in accordance with the present invention a method of making a composite oxide thin film, characterized by: using a plurality of sputtering targets having atomic compositions corresponding, respectively, to atomic compositions of blocks which constitute a basic cell of the composite oxide thin film to be made, the said targets also containing atoms capable of bringing about a chemical self-assembling effect; using a sputtering atmosphere containing a gas capable of bringing about a chemical self-assembling effect; using a crystallographically oriented crystalline substrate on which the composite oxide thin film is to be layered; holding the substrate at a surface diffusion temperature; sputtering the said sputtering targets in turn in the said sputtering atmosphere with the said gas at a controlled concentration and a sputtering time period controlled for each of the said targets to cause the blocks of the said basic cell to epitaxially grow in sequence over the substrate.

The composite oxide thin film may be used as a thin film of a material selected from the class which consists of ferroelectric material, magnetic material, semiconductor material, nonlinear optical material, insulating material, transparent electrode material, low dielectric material and superconducting material.

Thus, the blocks which make up a composite oxide thin film may be layered on a substrate with their respective compositions and film thicknesses controlled.

The said surface diffusion temperature is such a temperature as to cause surface atoms forming the composite oxide during sputtering to move over surface and to reach lattice points in each of the said blocks. This feature permits making a composite oxide thin film satisfactory in crystallinity and allows the temperature needed to heat the substrate lower than the crystal growth temperature at thermal equilibrium.

The said atoms capable of bringing about a self-assembling effect are atoms substituted for a part of constituent atoms of a particular block of the blocks which make up said composite oxide thin film to prompt reaction acceleration and structural stabilization of said blocks and/or to reduce lattice mismatch between said particular block and the other or another block to be layered on the particular block, thereby to facilitate forming the said composite oxide thin film.

Alternatively or in addition, the said gas capable of bringing about the chemical self-assembling effect is an oxidizing gas such that controlling its partial pressure in the said sputtering atmosphere during sputtering controls the concentration of oxygen taken into a particular block of the composite oxide thin film, which in turn controls the hole concentration of the said particular block, thereby reducing lattice mismatch between the said particular block and the other or another block to be layered on the particular block. These features gain in the concentration of holes in a particular block of a composite oxide thin film, augment the ionic bondability, and thus reduce or practically eliminate lattice mismatch between the said particular block and the other or another block to be layered on the particular block, thereby permitting making a composite oxide thin film excellent in crystallinity.

The said crystallographically oriented crystalline substrate has a block thereon in which a portion of constituent atoms of a particular block of said blocks constituting said composite oxide thin film is substituted with atoms capable of bringing about a chemical self-assembling effect as aforesaid. This feature practically eliminates lattice mismatch between an oriented crystalline substrate and a block to be formed thereon of the composite oxide thin film, permits layering the composite oxide thin film excellent in crystallinity and expands the usable materials forming the substrate.

The said composite oxide thin film is a thin film of Cu group high temperature superconductor, wherein the said blocks constituting the said basic cell are a charge supply block and a superconducting block of the Cu group high temperature superconductor, the said gas capable of bringing about the chemical self-assembling effect is an oxidizing gas, the said atoms capable of bringing about the chemical self-assembling are atoms which are greater in ionic valence number than Cu atoms, are relatively small in ionic radius and have an oxygen coordination number not less than 6, and the said oriented crystalline substrate is a substrate having thereon a buffer block in which a portion of Cu atoms of said charge supply block is substituted with the said atoms.

(Deleted)

This feature gains in the hole concentration in the charge supply block, increases the strength of ionic bond and thus reduces or practically eliminates lattice mismatch between the charge supply and superconducting block.

The present invention provides in another form of implementation thereof a method of making a thin film of a composite oxide wherein the composite oxide has a basic unit cell comprised of a first and a second block, characterized in that the method comprises the steps of: heating, in a vacuum atmosphere, an oriented crystalline substrate to a selected temperature; forming, in the said vacuum atmosphere, a buffer layer on the said heated substrate by sputtering from a target for the composite oxide thin film having atoms of a selected element mixed therein in a selected amount or from a target made of a material enough matching in lattice property with the said basic unit cell; introducing an oxidizing gas under a selected pressure into the said vacuum atmosphere; and then a) forming a first block constituting the said first block of the said basic unit cell on the said buffer layer by sputtering from a target having an atomic composition constituting the said first block of the composite oxide thin film until the said first block being formed has its thickness determined for the said first block in the said basic unit cell; b) forming a second block constituting the said second block of the said basic unit cell on the said first block by sputtering from a target having an atomic composition constituting the said first block of the composite oxide thin film until the said second block being formed has its thickness determined for the said second block in the said basic unit cell; c) repeating a step like step a) or b) by a number determined by a type of the said basic unit cell of the composite oxide thin film; and repeating steps a) to c) or c) to a) to make a thin film of composite oxide having a desired thickness.

According to this method, one of blocks of a composite oxide thin film made matching in lattice property with an oriented crystalline substrate is allowed to grow epitaxially over it, and the other block made matching in lattice property with the one block is allowed to grow epitaxially thereon, with each of the block layered in its thickness controlled, thereby permitting a composite oxide thin film to be made having a desired basic unit cell. Further, heating a substrate to a selected temperature and forming block one top on another in an oxidizing atmosphere allows the surface diffusion and surface reaction to occur block by block with each block growing epitaxially. Furthermore, a composite oxide thin film as desired is obtainable in situ (in a same vacuum container), without breaking the vacuum and as grown.

The present invention also provides in another form of implementation thereof a method of making a thin film of a Cu group high temperature superconductor wherein the superconductor has a basic unit cell comprised of a charge supply block and a superconducting block, characterized in that the method comprises the steps of: heating, in a vacuum atmosphere, an oriented crystalline substrate to a selected temperature; forming, in the said vacuum atmosphere, a buffer layer on the said heated substrate by sputtering from a target for the charge supply block and having atoms of a selected element mixed therein in a selected amount or from a target made of a material enough matching in lattice property with the said basic unit cell; introducing an oxidizing gas under a selected pressure into the said vacuum atmosphere; and then a) forming a first block constituting the said superconducting block on the said buffer layer by sputtering from a target for the superconducting block until the said first block being formed has its thickness determined for the said superconducting block in the said basic unit cell; b) forming a second block constituting the said charge supply block on the said first block by sputtering from the target for the charge supply block until the said second block being formed has its thickness determined for the said charge supply block in the said basic unit cell; and repeating steps a) and b) or steps b) and a) to make a thin film of the Cu high temperature superconductor having a selected thickness.

According to this method, a charge supply block made matching in lattice property with an oriented crystalline substrate is allowed to grow epitaxially over it, and a superconducting block made matching in lattice property with the charge supply block is allowed to grow epitaxially thereon, with each of the block formed in its thickness controlled, thereby permitting a Cu group high temperature superconducting thin film to be made having a desired film thickness. Further, heating a substrate to a selected temperature and forming block one top on another in an oxidizing atmosphere allows the surface diffusion and surface reaction to occur block by block with each block growing epitaxially. Furthermore, a thin Cu group high temperature film having a desired superconducting property is obtainable in situ (in a same vacuum container), without breaking the vacuum and as grown.

The present invention further provides in another form of implementation thereof a method of making a thin film of a Cu group high temperature superconductor wherein the superconductor has a basic unit cell comprised of a charge supply block and a superconducting block, characterized in that the method comprises the steps of: heating, in a vacuum atmosphere, an oriented crystalline substrate to a selected temperature; forming, in the said vacuum atmosphere, a buffer layer on the said heated substrate by sputtering from a target for the charge supply block and having atoms of a selected element mixed therein in a selected amount or from a target made of a material enough matching in lattice property with the said basic unit cell; introducing an oxidizing gas under a selected pressure into the said vacuum atmosphere; and then a) forming a first block constituting the said superconducting block on the said buffer block by sputtering from a target for the superconducting block until the said first block being formed has its thickness determined for the said superconducting block in the said basic unit cell; b) forming a second block constituting the said charge supply block on the said first block by sputtering from the target for the charge supply block until the said second block being formed has its thickness determined for the said charge supply block in the said basic unit cell; repeating steps a) and b) to make a thin film of the Cu high temperature superconductor having a selected thickness; and then c) forming an insulating layer having a selected film thickness on the said formed thin film of Cu high temperature superconductor by sputtering from a third target made of an insulating material; and then repeating steps a) and b) or steps b) and a) to make a thin film of the Cu high temperature superconductor having a selected thickness. This method allows a Josephson junction device or the like in which an insulator as a barrier is interposed between thin superconducting films to be made in situ, without breaking vacuum and as grown.

The above mentioned particular element whose atoms are substituted for Cu atoms may be one or more elements selected from the class that consists of Tl, Bi, Pb, In, Ga, Al, B, Sn, Ge, Si, C, Ti, V, Cr, Mn, Fe, Co, Ni, Zr, Nb, Mo, W, Re, Ru and Os. The aforementioned oxidizing gas may be $O_2$, $O_3$, $N_2O$ or $NO_2$. This leads to the increment of oxygen in the charge reservoir block, as a result, its concentration of hole increases.

The present invention also provided a composite oxide thin film making apparatus for carrying out a composite oxide thin film making method as set forth in claim 1 in the appended claims, which apparatus comprises a thin film making sputtering chamber, a load locking chamber, a plurality of sputtering power supply units, a substrate holding, rotating and heating unit, shutters and their respective rotation control units, a gas flow rate and pressure control unit, two evacuating units and a control computer.

The said thin film making sputtering chamber may include at least two vertically disposed targets; shutters disposed parallel to surfaces of said targets, respectively; and the said substrate holding, rotating and heating unit for positioning the substrate so that a surface thereof extends parallel to a direction normal to a surface of each of the said targets and lies outside of a sputtering plasma and then rotating and heating the substrate so positioned.

These features allows a composite oxide thin film to be obtained which is free from damage by impingement of charged sputtering particles and are uniform in both film thickness and composition distributions.

The said load locking chamber may be made capable of exchanging the substrate without breaking vacuum in the said thin film making sputtering chamber, the said load locking chamber then having an evaporating means in it. The feature allows an electrode in a Josephson junction device or the like to be formed in situ, without breaking vacuum and as grown.

The said sputtering power supply units; the said substrate holding, rotating and heating unit; the said shutters and their rotation control units; the said gas flow rate and pressure control unit; and the said evacuating units: are provided with sensors for measuring magnitudes of sputtering electric power; rate of rotation and temperature; positions, gas flow rate and pressure; and degrees of vacuum, respectively, each include a terminal computer for controlling operation of the corresponding unit, and an actuator driven in response to an output of the said terminal computer, and also each include a communication means for permitting each corresponding terminal computer to make a communication with the said control computer, whereby the said actuator is controllably driven in response to such a communication with the said control computer and an output of the corresponding sensor.

The present invention also provides a method of making a composite oxide thin film, characterized in that it comprises the steps of: preparing a plurality of sputtering targets made of materials, respectively, having atomic compositions of a like plurality of block which constitute a basic unit cell of the composite oxide thin film; and forming on a substrate respective block of the said compositions successively by sputtering from the said sputtering targets by turns in successive sputtering operations each controllably so that each of the said block has a film thickness determined for the corresponding block in the said basic unit cell, wherein a programmed control computer is entered with input data for respective sputtering power magnitudes for the said sputtering targets, rate(s) of rotation and temperature(s) of the said substrate, gas flow rate(s) and pressure(s), degree(s) of vacuum, respective rates of deposition of said block on the said substrate from the said target materials and respective time periods for deposition of the said block on said substrate determined from the respective thicknesses of the said block in the said basic unit cell, and respective numbers of repetition of the said sputtering operations needed corresponding to a desired thickness of the said composite oxide thin film; and thence the said programmed control computer in response to these input data acts to communicate with terminal computers associated with a plurality of sputtering power supply units, a substrate holding, rotating and heating unit, shutters and their respective rotation control units, a gas flow rate and pressure control unit, and a plurality of evacuating units, respectively, to control respective operations of these units.

The present invention also provides a method of making a Cu group high temperature superconducting thin film having a basic unit cell comprised of a charge supply block and a superconducting block, characterized in that it comprises the steps of: preparing a first sputtering target made of a first material for the charge supply block and a second sputtering target made of a material for the superconducting block; and forming on a substrate alternately a first and a second block constituting the said charge supply and superconducting block, respectively, by sputtering from the said first and second targets in alternate sputtering operations each controllably so that each of the said first and second block has a film thickness determined for the corresponding one of the said charge supply and superconducting block in the said basic unit cell, wherein a programmed control computer is entered with input date for respective sputtering power magnitudes for the said first and second sputtering targets, rate(s) of rotation and temperature(a) of the said substrate, gas flow rate(s) and pressure(s), degree(s) of vacuum, respective rates of deposition of the said first and second block on the said substrate from the said first and second target materials and respective time periods for deposition of said first and second block on the said substrate determined from the respective thicknesses of the said charge supply and superconducting block in the said basic unit cell, and respective numbers of repetition of the said alternate sputtering operations needed corresponding to a desired thickness of the said Cu group high temperature superconducting thin film; and thence the said programmed control computer in response to these input data acts to communicate with terminal computers associated with a plurality of sputtering power supply units, a substrate holding, rotating and heating unit, shutters and their respective rotation control units, a gas flow rate and pressure control unit, and two evacuating units, respectively, to control respective operations of these units.

The present invention further provides a record medium stored with a process control program for a computer to execute the controlled manufacture of a composite oxide thin film wherein there are prepared a plurality of sputtering targets made of materials having atomic compositions of a like plurality of block, respectively, which constitute a basic unit cell of the composite oxide thin film, to form on a substrate respective block of the said compositions successively by sputtering from the said sputtering targets by turns in successive sputtering operations each controllably so that each of the said block has a film thickness determined for the corresponding block in the said basic unit cell, characterized in that the said process control program comprises input data for respective sputtering power magnitudes for the said sputtering targets, rate(s) of rotation and temperature(s) of the said substrate, gas flow rate(s) and pressure(s), degree(s) of vacuum, respective rates of deposition of the said block on the said substrate from the said target materials and respective time periods for deposition of the said block on the said substrate determined from the respective thicknesses of the said block in said basic unit cell, and respective numbers of repetition of the said sputtering operations needed corresponding to a desired thickness of the said composite oxide thin film, and the said input data are enterable into a computer to have the computer communicate with terminal computers associated, respectively, with a plurality of sputtering power supply units, a substrate holding, rotating and heating unit, shutters and their respective rotation control units, a gas flow rate and pressure control unit, and a plurality of evacuating units to control respective operations of these units.

These features of the invention allow a composite oxide thin film having block as many as 100 to 10,000 in number to be manufactured without resort to human aides and precisely.

The present invention also provides in another form of implementation thereof a record medium stored with a process control program for a computer to execute the controlled manufacture of a Cu group high temperature superconducting thin film having a basic unit cell comprised of a charge supply block and a superconducting block, wherein there are prepared a first sputtering target made of a first material for the charge supply block and a second sputtering target made of a material for the superconducting block, to form on a substrate alternately a first and a second block constituting the said charge supply and superconducting block, respectively, by sputtering from the said first and second targets in alternate sputtering operations each controllably so that each of the said first and second block has a film thickness determined for the corresponding one of the said charge supply and superconducting block in the said basic unit cell, characterized in that the said process control program comprises input data for respective sputtering power magnitudes for the said sputtering targets, rate(s) of rotation and temperature(s) of the said substrate, gas flow rate(s) and pressure(s), degree(s) of vacuum, respective rates of deposition of the said block on the said substrate from the said target materials and respective time periods for deposition of the said block on the said substrate determined from the respective thicknesses of said block in the said basic unit cell, and respective numbers of repetition of the said sputtering operations needed corresponding to a desired thickness of the said composite oxide thin film, and the said input data are enterable into a computer to have the computer communicate with terminal computers associated, respectively, with a plurality of sputtering power supply units, a substrate holding, rotating and heating unit, shutters and their respective rotation control units, a gas flow rate and pressure control unit, and a plurality of evacuating units to control respective operations of these units.

These features of the invention allow a Cu group high temperature superconducting thin film having block as many as 100 to 10,000 in number to be manufactured without resort to human aides and precisely.

An apparatus of the present invention so far described enables a composite oxide thin film and a Cu group high temperature superconducting thin film to be made by a combination of physical control of compositions and film thicknesses, surface diffusion effect, chemical self-assembling effects, and epitaxial growth using an oriented crystalline substrate.

A thin film of a Cu group high temperature superconductor made by a method or an apparatus as described above is excellent in superconducting properties and can be readily manufactured, especially when the said superconductor is a Cu group high temperature superconductor as represented by those having Cu-1223, Cu-1234 and Cu-1245 crystalline structures, and specifically a (Cu, M) group high temperature superconductor expressed by chemical formula:

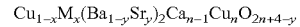
$Cu_{1-x}M_x(Ba_{1-y}Sr_y)_2Ca_{n-1}Cu_nO_{2n+4-y}$ where M represents one or more elements selected from the class which consists of Tl, Bi, Pb, In, Ga, Al, B, Sn, Ge, Si, C, Ti, V, Cr, Mn, Fe, Co, Ni, Zr, Nb, Mo, W, Re, Ru and Os and where $0 \leq x \leq 1.0$, $0 \leq y \leq 1$, $0 \leq z \leq 1, -2 \leq w \leq 4$, and $3 \leq n \leq 15$.

A thin film of a Cu group high temperature superconductor made by a method or an apparatus as described above is excellent in superconducting properties and can be readily manufactured especially when the said superconductor is a (Cu, M) group high temperature superconductor expressed by chemical formula:

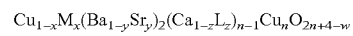
$Cu_{1-x}M_x(Ba_{1-y}Sr_y)_2(Ca_{1-z}L_z)_{n-1}Cu_nO_{2n+4-w}$ where M represents one or more elements selected from the class which consists of Tl, Bi, Pb, In, Ga, Al, B, Sn, Ge, Si, C, Ti, V, Cr, Mn, Fe, Co, Ni, Zr, Nb, Mo, W, Re, Ru and Os and L represents one or more elements selected from the class which consists of Mg and alkali metal elements and where $0 \leq x \leq 1.0$, $0 \leq y \leq 1$, $0 \leq z \leq 1, -2 \leq w \leq 4$, and $3 \leq n \leq 16$.

A thin film of a Cu group high temperature superconductor made by a method or an apparatus as described above is excellent in superconducting properties especially when the said superconductor is a (Cu, Tl) group high temperature superconductor expressed by chemical formula:

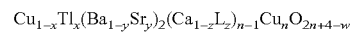
$Cu_{1-x}Tl_x(Ba_{1-y}Sr_y)_2(Ca_{1-z}L_z)_{n-1}Cu_nO_{2n+4-w}$ where L represents one or more elements selected from the class which consists of Mg and alkali metal elements and where $0 \leq x \leq 1.0$, $0 \leq y \leq 1$, $0 \leq z \leq 1, -2 \leq w \leq 4$, and $3 \leq n \leq 16$.

A thin film of a Cu group high temperature superconductor made by a method or an apparatus as described above is excellent in superconducting properties and can be readily manufactured especially when the said superconductor is a (Cu, Tl) group high temperature superconductor expressed by chemical formula:

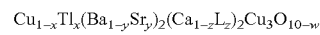
$Cu_{1-x}Tl_x(Ba_{1-y}Sr_y)_2(Ca_{1-z}L_z)_2Cu_3O_{10-w}$ where L represents one or more elements selected from the class which consists of Mg and alkali metal elements and where $0 \leq x \leq 1$, $0 \leq y \leq 1$, $0 \leq z \leq 1, -2 \leq w \leq 4$.

A thin film of a Cu group high temperature superconductor made by a method or an apparatus as described above is excellent in superconducting properties and can be readily manufactured especially when the said superconductor is a (Cu, Re) group high temperature superconductor expressed by chemical formula:

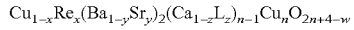

where L represents one or more elements selected from the class which consists of Mg and alkali metal elements and where $0 \leq x \leq 1$, $0 \leq y \leq 1$, $0 \leq z \leq 1$, $-2 \leq w \leq 4$, and $3 \leq n \leq 16$.

A thin film of a Cu group high temperature superconductor made by a method or an apparatus as described above is excellent and can be readily manufactured especially when the said superconductor is a (Cu, M) group high temperature superconductor expressed by chemical formula:

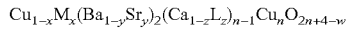

where M represents one or more elements selected from the class which consists of Ti, V, Cr, B, Si and C and L represents one or more elements selected from the class which consists of Mg and alkali metal elements and where $0 \leq x \leq 1.0$, $0 \leq y \leq 1$, $0 \leq z \leq 1$, $-2 \leq w \leq 4$, and $3 \leq n \leq 16$.

BRIEF DESCRIPTION OF THE DRAWINGS

The present invention will better be understood from the following detailed description and the drawings attached hereto showing certain illustrative embodiments of the present invention. In this connection, it should be noted that such embodiments illustrated in the accompanying drawings hereof are intended in no way to limit the present invention but to facilitate an explanation and understanding thereof. In the drawings.

BEST MODES FOR CARRYING OUT THE INVENTION

Figure 1:
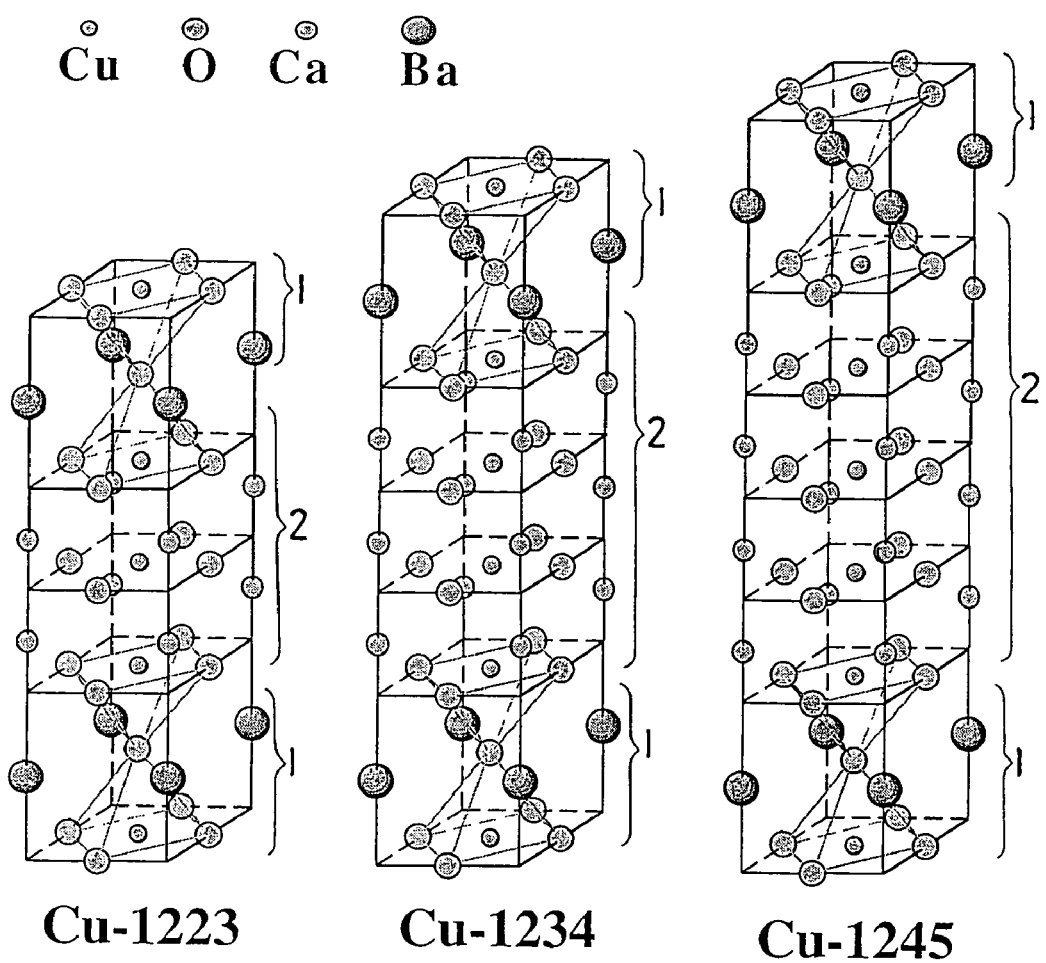
FIG. 1 is a schematic diagram illustrating the basic unit cell structures of typical Cu group high temperature superconductors.

Hereinafter, the present invention will be described in detail with reference to suitable forms of embodiment thereof illustrated in the drawing figures.

Mention is first made of how the composition and film thickness are to be physically controlled.

FIG. 1 illustrates basic unit cells of typical Cu group high temperature superconductors. Each of these basic unit cells is made up of a charge supply block of $CuBa_2O_{4-y}$ making a top and a bottom block of the basic unit cell and a superconducting block 2 of $Ca_{n-1}Cu_nO_{2n}$ (where n=3-5) making up the block or block other than these top and bottom block of the unit cell.

According to the present invention, a target for the charge supply block 1, having its composition $CuBa_2O_{4-y}$, and a target for the superconducting block 2, having its composition $Ca_{n-1}Cu_nO_{2n}$, are separately prepared, and are alternately subjected to time-controlled sputtering operations so as to form one block on top of another successively, thereby making up a thin film of Cu group superconductor desired. For example, if a thin film of Cu group superconductor with Cu-1234 structure as shown in FIG. 1 is to be made, time periods t1 and t2 for which the charge supply block 1 and the superconducting block 2 are formed, respectively, having their respective film thicknesses are derived from their respective preestablished rates of deposition from those targets. Then, the target for the charge supply block is sputtered for time period t1 followed by sputtering the target for the superconducting block for time period t2. By repeating these alternate sputtering processes a required number of times, a thin film with a desired film thickness of Cu group superconductor having the Cu-1234 structure is obtained on a substrate.

According to this method, using the targets each uniformly composed allows forming the charge supply block 1 and the superconducting block 2 each uniformly composed and having a film thickness controlled by the sputtering time period t1, t2 and in turn making up a thin film of Cu group superconductor having a desired basic unit cell. Further, the substrate temperature is suitably set up to cause the constituent atoms on each blockurface to undergo both surface diffusion and reaction, thereby improving the interfacial epitaxial growability.

Mention is next made of chemical self-assembling. The term "self-assembling" is herein intended to refer, as for the crystalline structure of a substance to be realized, to applying a chemical modification to a raw material thereof by substituting atoms of a particular constituent element of the raw material with atoms of another element high in reactivity and structural controllability, or to adding to the raw material such substitute atoms, so as to permit the structure to be realized with greater completeness. This measure in the present invention is designed to cope with the problem in making up a thin film of Cu group superconductor that the charge supply block 1 and the superconducting block 2 differ in the length of crystallographic a-axis, and thus are poor in lattice matching and are therefore hard to form in a single crystalline structure in which they are grown epitaxially.

Substituting Cu atoms in the charge supply block 1 with atoms that are larger in ionic valence number than Cu atoms and relatively small in ionic radius and have an oxygen coordination number not less than six at a particular proportion ($Cu_{1-x}M_xBa_2O_{4-y}$, where M is an element of the substitutional atoms) raises the hole concentration, increases the ionicity and shortens the CuO bond length, in the charge supply block 1. This effect makes the charge supply block 1 and the superconducting block 2 closer to each other in the length of crystallographic a-axis and matching in lattice, thereby permitting a single crystal structure to be formed in which the charge supply block 1 and the superconducting block 2 are each epitaxially grown. Exhibiting these effects are atoms of Tl and one or more elements such as in transition elements.

Also, increasing the number of O atoms coordinating with Cu atoms in the charge supply block 1 increases the valence of Cu ions and the ionicity and shortens the CuO bond length, in the charge supply block 1. However, the fact that the valence of Cu ions if excessively increased makes them unstable requires that part of Cu atoms be substituted with ions having higher valence.

This effect makes the charge supply block 1 and the superconducting block 2 closer to each other in the length of crystallographic a-axis, improves their lattice matching and thereby permits yielding a single crystalline structure in which the charge supply block 1 and the superconducting block 2 are each epitaxially grown.

In the present invention, with the use of the target for the charge supply block composed of $Cu_{1-x}M_xBa_2O_{4-y}$ in which Cu atoms are substituted at a particular proportion (where M is an element of the substitutional atoms), a reactive sputtering process in which the sputtering atmosphere has an oxidizing gas admixed therein is employed to make the charge supply block 1 and the superconducting block 2 closer to each other in the length of crystallographic a-axis and to improve their lattice matching, thereby permit yielding a single crystalline structure in which the charge supply block 1 and the superconducting block 2 are each epitaxially grown.

Mention is next made of epitaxial growth using a crystallographically oriented crystalline substrate.

Causing a Cu group superconducting film satisfactory in crystallinity requires the use of an orientated crystalline substrate satisfactory in lattice matching property.

Further, the orientated crystalline substrate has been limited as regards usable types of compositions in forming a Cu group superconducting film thereon. Take, for example, $SrTiO_3$ widely used to form an oriented crystalline substrate in the prior art. However, this composition has a lattice constant in the crystallographic a-axis of 0.390 nm while composition $CaCuO_2$ used to form the superconducting block has a lattice constant in the crystallographic a-axis of 0.384. Such a difference so small in lattice constant is sufficient to give rise to a large lattice mismatch enough to render the epitaxial growth difficult to occur or if it occurs to permit the growth only in quite a limited temperature range.

It is a feature of the present invention to use the charge supply block of composition $Cu_{1-x}M_xBa_2O_{4-y}$ as a buffer block in order to satisfy lattice matching conditions for the orientation crystalline substrate and superconducting block, thereby facilitating the epitaxial growth while expanding the type of compositions usable to form the orientation crystalline substrate. It may be noted in this connection that the orientation crystalline substrate can then be made of silicon steel.

The cupper group superconducting film making method discussed above is hereinafter referred to as "SAM" ("Self Assembling Epitaxy" method).

Mention is next made of the makeup of an apparatus for effectuating the SAE method in accordance with the present invention.

Figure 2:
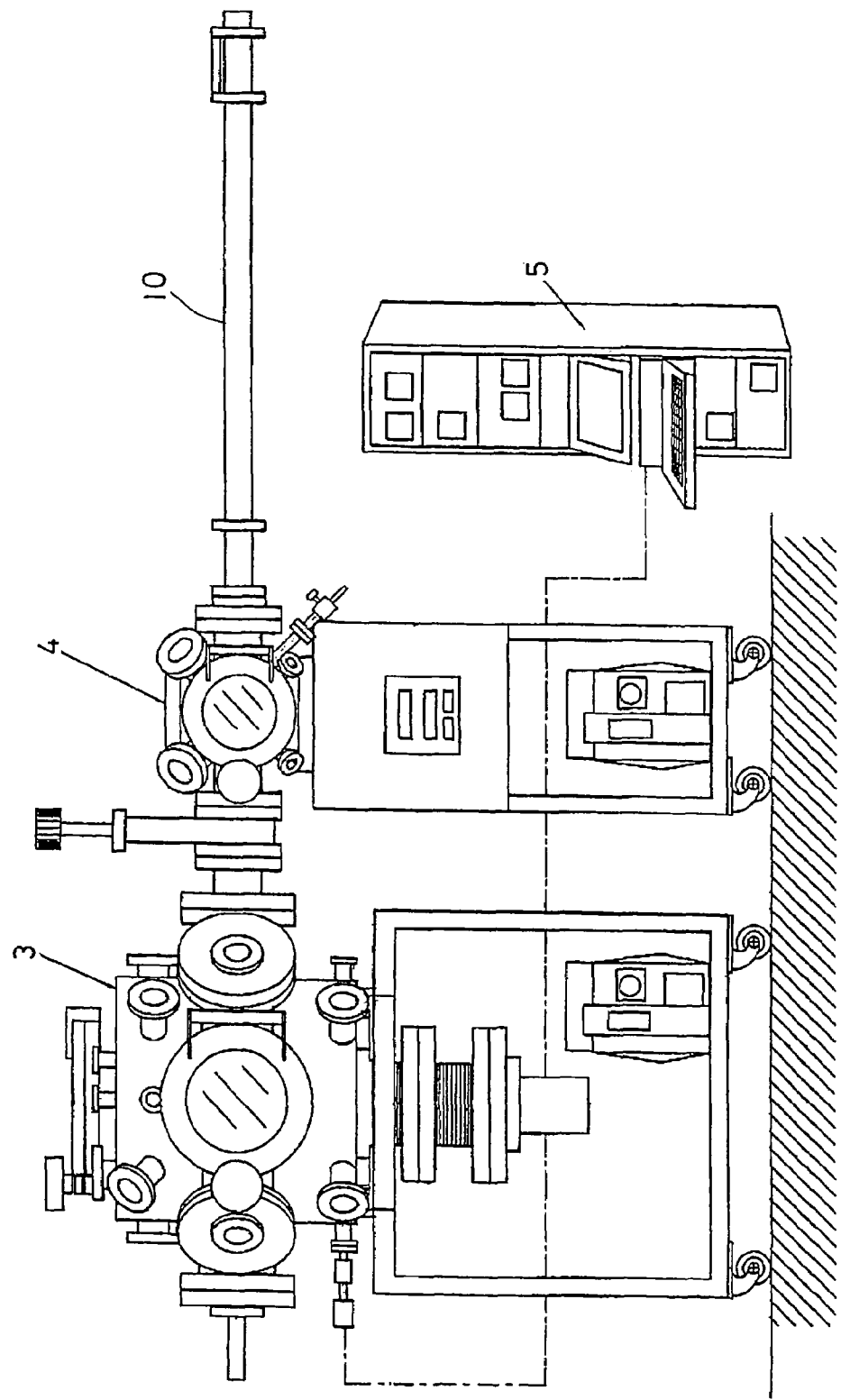
FIG. 2 is a schematic overall view illustrating an apparatus for making a thin film of a composite oxide.
Figure 3:
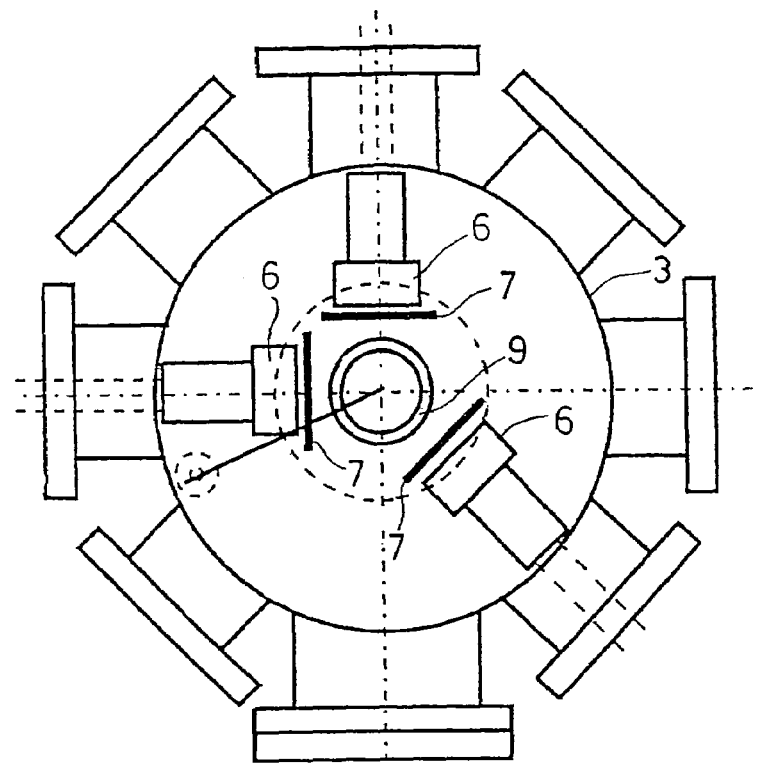
FIG. 3 is a schematic top perspective view illustrating a thin film sputtering chamber.
Figure 4:
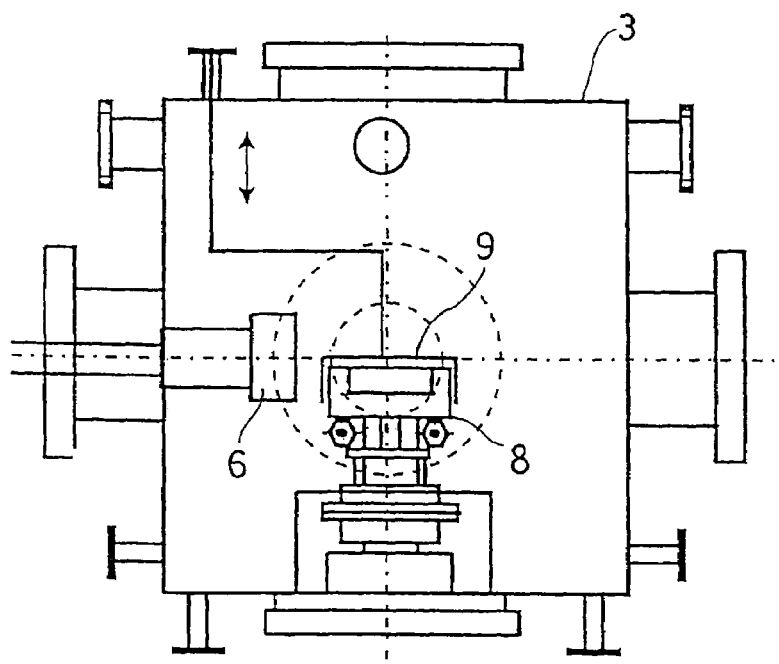
FIG. 4 is a schematic side perspective view of the thin film sputtering chamber.

The general makeup of the apparatus of the invention is illustrated in FIGS. 2, 3 and 4. FIG. 2 is a schematic overall view of the apparatus, FIG. 3 is a schematic top perspective view of a sputtering chamber for making a thin film and FIG. 4 is a schematic side perspective view of this sputtering film making chamber This apparatus is shown to include the sputtering film making chamber 3 being an ultrahigh vacuum deposition chamber (with a basic pressure of $1 \times 10^{-7}$ Torr), a load locking chamber 4 connected via a gate valve to the film making chamber 3, and a control computer 5. The sputtering film making chamber 3 is provided in it with three sputtering electrode systems 6 having three different targets (sintered $Ba_2CuO_2$ and $CaCuO_2$ targets and an insulator target) mounted to extend vertically to them, respectively, and three shutters 7 disposed adjacent to the targets so as to cover them, respectively. The shutters 7 are adapted to be driven independently of each other by their respective rotation control units (not shown) in order to control deposition and non-deposition of a unit film on a substrate by sputtering. The substrate is mounted on a substrate holding/rotating/heating unit 8 to have its speed of rotation and its temperature controllable. The substrate is so mounted that its surface extends parallel to the normal to each of the surfaces of the targets and lies outside of a sputtering plasma. Such an arrangement permits making up a Cu group high temperature superconducting thin film that is devoid of damage by the impingement of sputtering charged particles and is uniform in film thickness and composition distribution.

Shown also in FIGS. 3 and 4 is a shutter 9 provided to prevent contamination of the substrate surface. The apparatus of the invention illustrated further includes a gas flow and pressure control unit, two evacuation systems, a variety of viewing ports, sputtering gun attachments, targets for PLD (laser ablation targets), a laser beam inlet section and so on, which are, however, omitted from illustration. Moreover, the main part and principal component of the apparatus are so made up that they are common to and compatible with a Josephson junction property evaluating unit and a laser ablation (pulsed laser deposition: PLD) unit.

Figure 5:
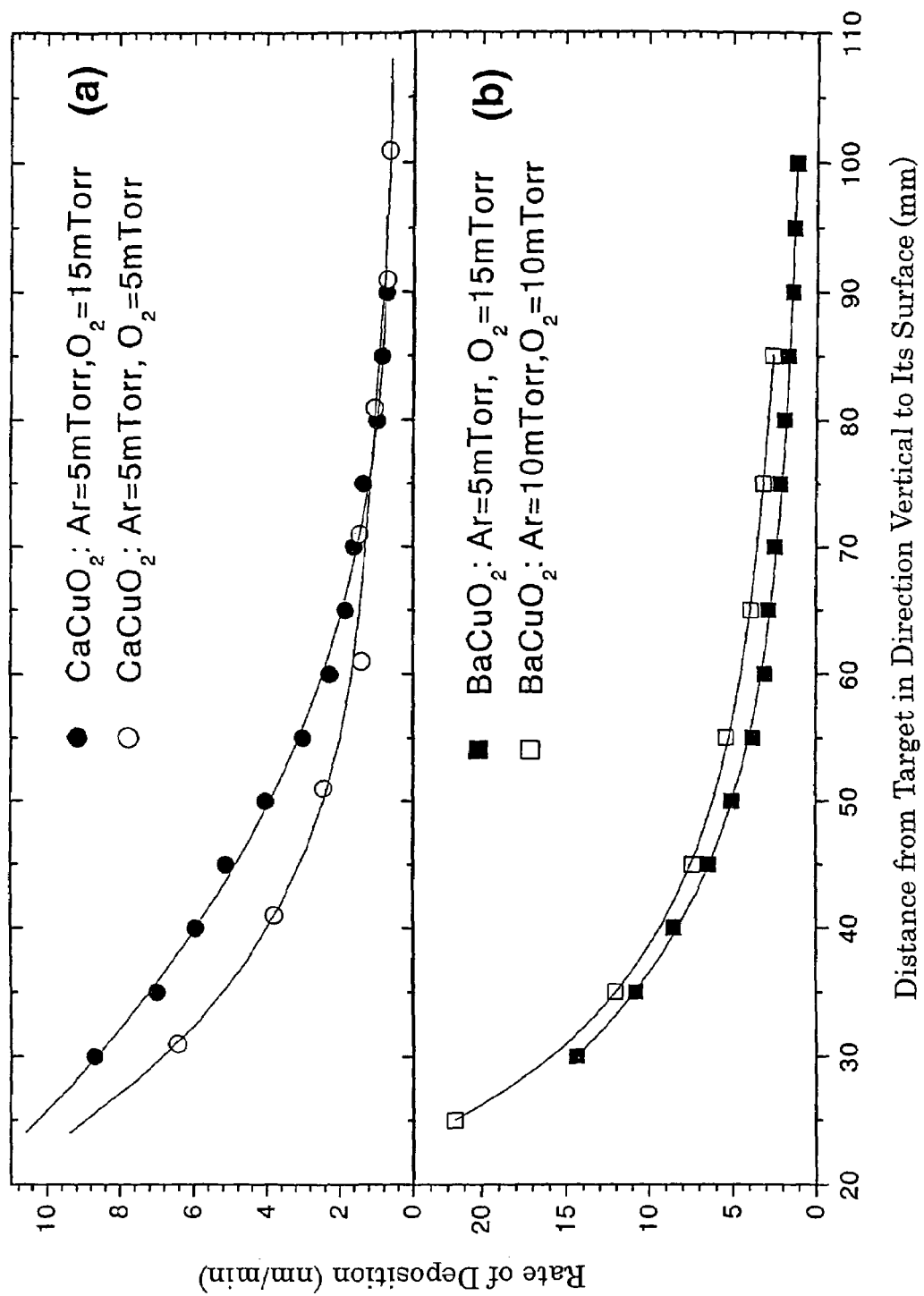
FIG. 5 is a graph illustrating a deposition rate distribution in a direction perpendicular to a target surface in the composite oxide thin film making apparatus.
Figure 6:
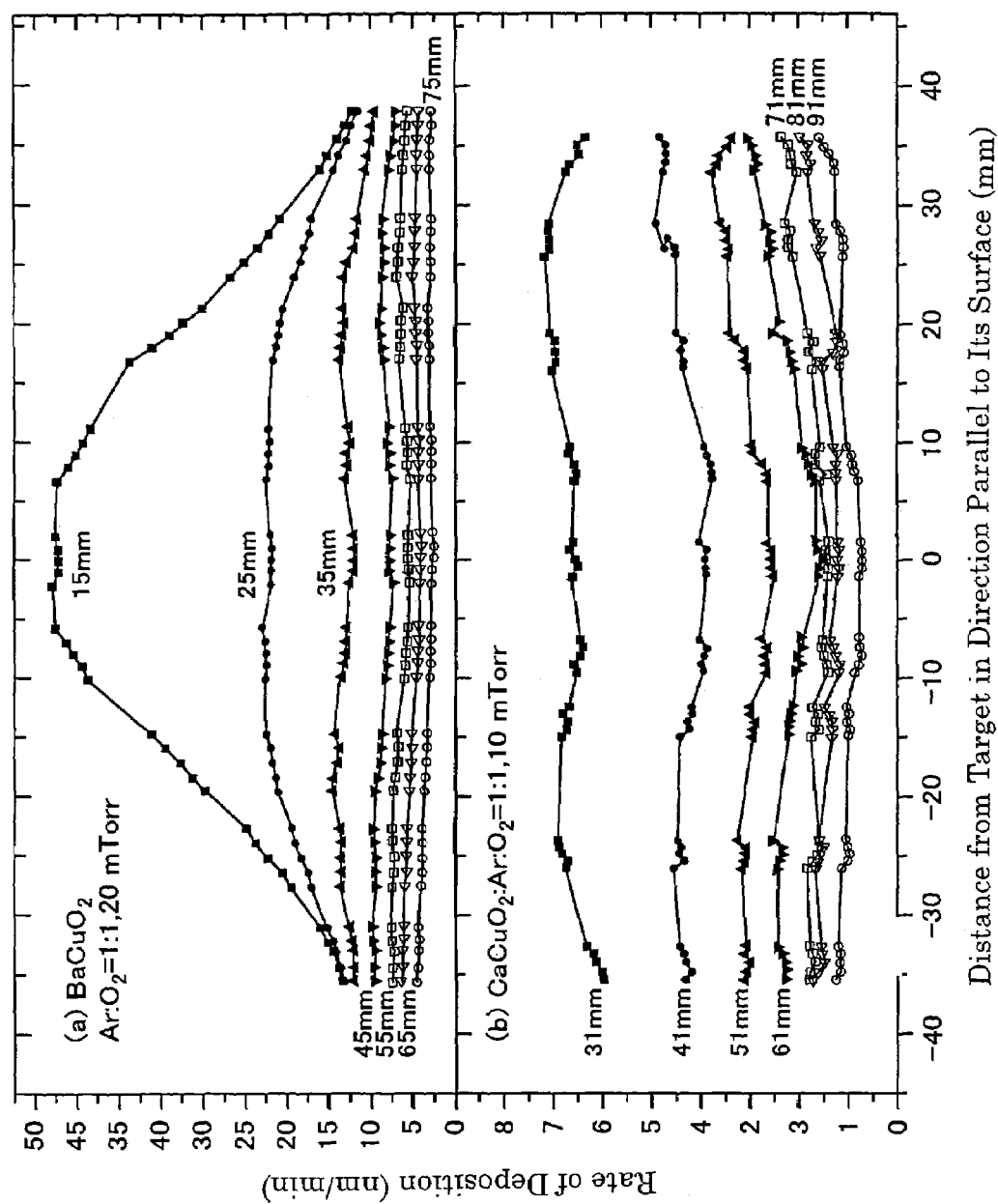
FIG. 6 is a graph illustrating a deposition rate distribution in a direction parallel to the target surface in the composite oxide thin film making apparatus.

FIG. 5 shows a rate of deposition distribution in a direction vertical to the target surface in the apparatus, and FIG. 6 shows a rate of deposition distribution in a direction parallel to the target surface in the apparatus.

As is apparent from FIGS. 5 and 6, at a vertical distance of 70 mm from the target there is found an excellent film thickness distribution in both vertical and parallel directions. In FIG. 6, numerical values assigned to the curves indicate vertical distances from the target.

Figure 7:
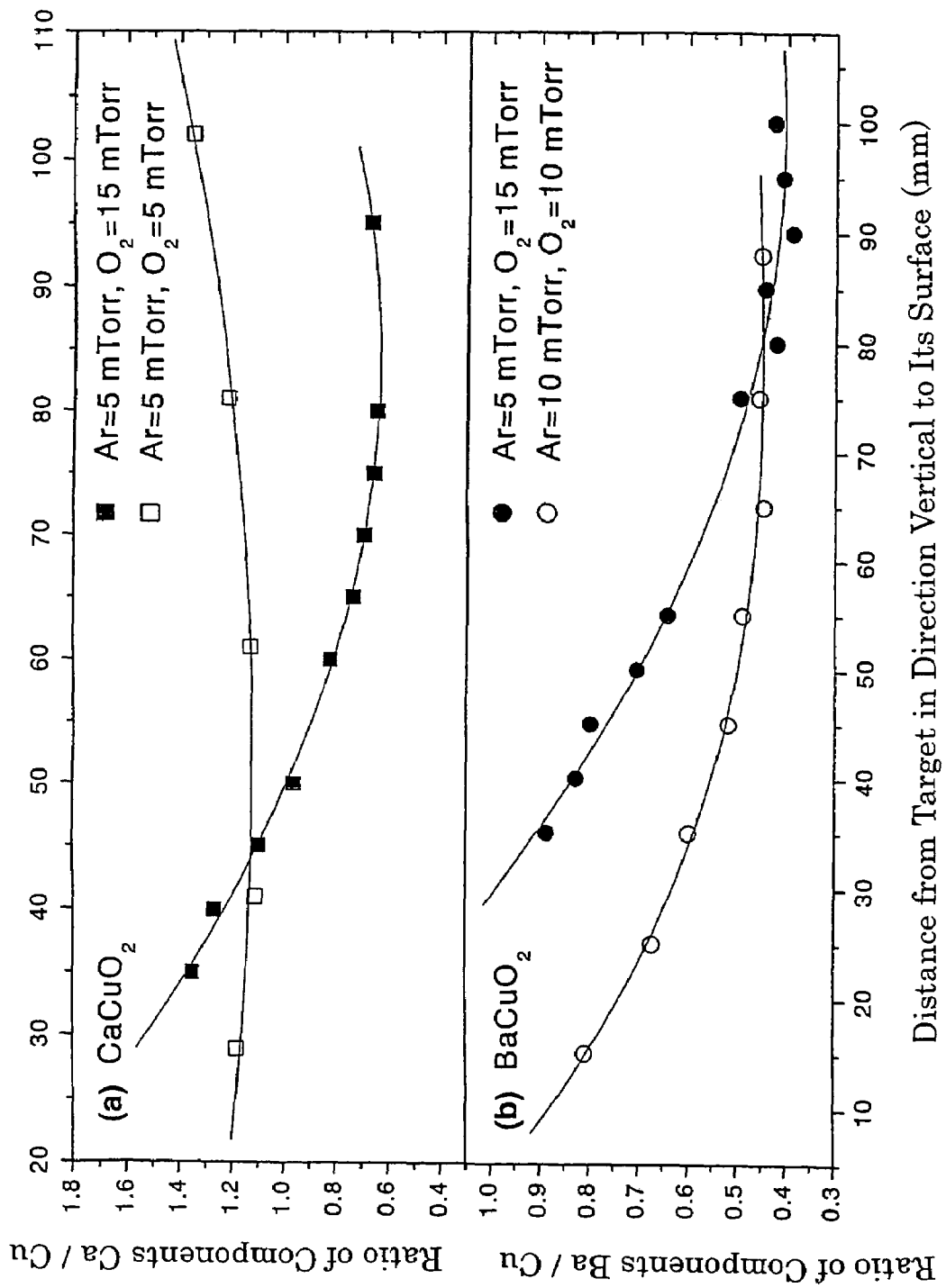
FIG. 7 is a graph illustrating distributions, in a direction perpendicular to the target surface, of ratios of component atoms making up a charge supply block and a superconducting block, respectively, the graph being shown with the gas composition ($Ar/O_2$) of the sputtering atmosphere as a parameter.
Figure 8:
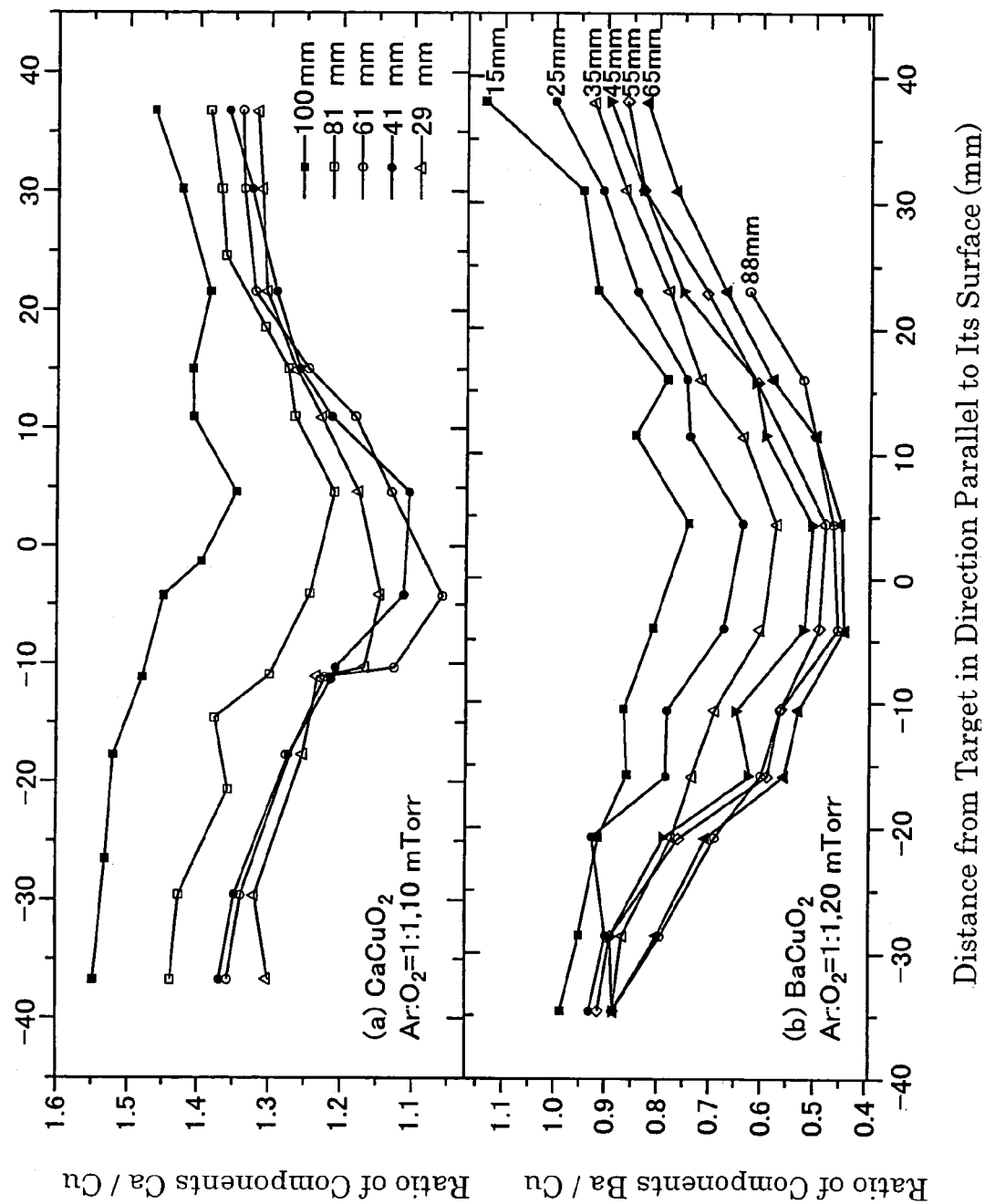
FIG. 8 is a graph illustrating distributions, in a direction parallel to the target surface, of ratios of component atoms making up a charge supply block and a superconducting block, respectively, the graph being shown with the gas composition ($Ar/O_2$) of the sputtering atmosphere as a parameter.

FIG. 7 shows a ratio of components distribution for constituent atoms of the charge supply and superconducting block in a direction vertical to the target when the substrate is set at a room temperature and with the sputtering atmosphere gas composition ($Ar/O_2$) taken as a parameter, and FIG. 8 shows a ratio of components distribution for constituent atoms of the charge supply and superconducting block in a direction parallel to the target when the substrate is set at a room temperature and with the sputtering atmosphere gas composition (Ar/$O_2$) taken as a parameter.

As is apparent from FIGS. 7 and 8, at a particular gas composition there is seen an excellent region of composition distribution that exists.

The load locking chamber 4 is provided with a transfer rod 10 that permits exchanging substrates without breaking a vacuum in the film making sputtering chamber, and has in its inside a sputtering and/or an evaporation means such as for making electrodes.

The film making sputtering chamber 3 is provided with a plurality of sputtering power supply systems; the substrate holding/rotating/heating unit 8; the shutters 7 and the shutter rotation control unit; the gas flow rate and pressure control unit; the two evacuating systems; sensors for sensing electric power, rate of rotation, temperature, position, gas flow rate, gas pressure and degree of vacuum, respectively; a terminal computer that controls driving each of the units; and actuators operable to be driven in response to outputs of the terminal computer. Also provided for the film making sputtering chamber 3 is a means that can communicate with the control computer 5 so that the relevant actuators may be driven controlled by the corresponding sensor outputs and communications with the control computer.

Mention is next made of modes of operation of the apparatus.

To make up a thin film of Cu group high temperature superconductor, the process of forming on a substrate alternately a charge supply block and a superconducting block as constituents of the Cu group superconducting film by controllably sputtering the substrate alternately from a target for the charge supply block and a target for the superconducting block with block film thicknesses controlled is carried out as follows. The control computer 5 is entered with respective magnitudes of sputtering power for the charge supply and superconducting block, speeds of rotation and temperatures of the substrate, gas flow rates and pressures, degrees of vacuum, opening time periods for the respective shutters for the targets and the numbers of repetition of sputtering steps corresponding to the desired film thickness of the Cu group superconducting film. Entered with these input values, the programmed control computer 5 communicates with the terminal computer to control the two sputtering power supply systems, the substrate holding/rotating/heating unit 8, the shutters and shutter rotation control unit, the gas flow rate and pressure control unit and the two evacuation systems. The Cu group high temperature superconductor thin film is thus produced.

A program for Cu group high temperature superconductor thin film manufacture is used, which is a computer program for controlling the manufacture of a thin film of Cu group high temperature superconductor with the aid of a computer. This computer program is responsive to input values for respective magnitudes of sputtering power for the charge supply and superconducting block, speeds of rotation and temperatures of the substrate, gas flow rates and pressures, degrees of vacuum, opening time periods for the respective shutters for the targets and the numbers of repetition of sputtering steps corresponding to the desired film thickness of the Cu group superconducting film to control the two sputtering power supply systems, the substrate holding/rotating/heating unit 8, the shutters and shutter rotation control unit, the gas flow rate and pressure control unit and the two evacuation systems.

Such a makeup of the apparatus allows a Cu group high temperature superconductor thin film with atomic block reaching as many as 100 to 1000 in number to be made precisely and without resort to human hands.

Figure 9:
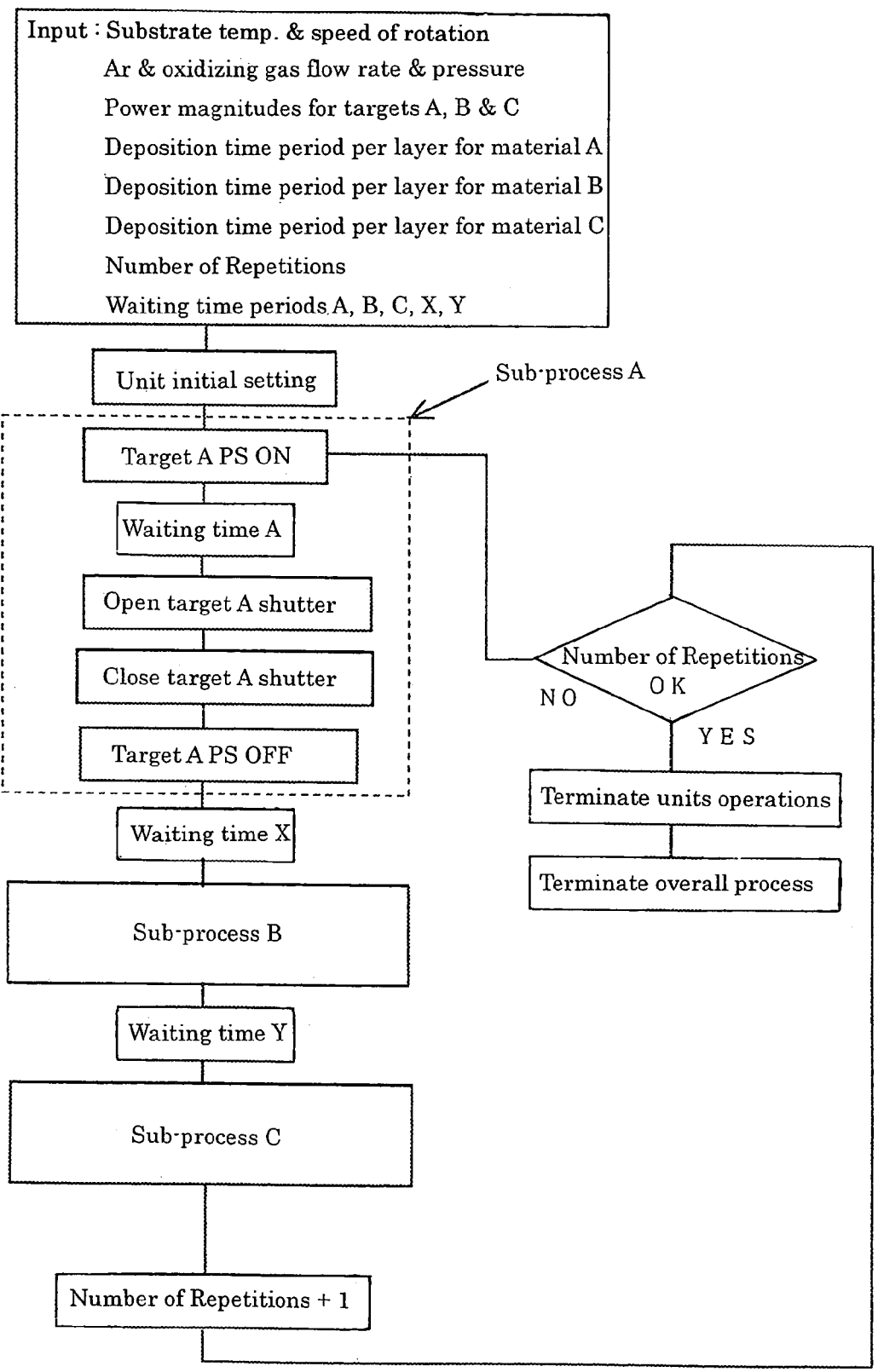
FIG. 9 is a flow chart illustrating a program of manufacture for making a composite oxide thin film.

FIG. 9 shows a flow chart of the program for the manufacture of a composite oxide thin film. In this example shown, use is made of three targets for film making.

The control computer 5 is first entered with inputs for the temperature and the speed of rotation of a substrate, flow rates and pressures of Ar gas and oxidizing gas ($O_2$ or $N_2O$), magnitudes of sputtering power for target A made of material A, target B made of material B and target C made of material C, time periods per block for materials A, B and C, the number of basic unit cells corresponding to the thickness of the composite oxide thin film to be made, namely the number of repetitions, and a waiting time suitably established to permit a fine adjustment each of the processes. Entered with these inputs, the control computer 5 then issues control instructions for the sputtering power supply systems, the substrate holding/rotating/heating unit, the shutters and shutter rotating units, the gas flow rate and pressure control unit and the two evacuation units, respectively. Then, upon receipt of the reports from the respective terminal computers for those control units that the control instructions are being complied with, the control computer 5 engages in executing a sub-process indicated in FIG. 9 as sub-process A. To wit, it issues control instructions to turn ON the sputtering power supply for the target A and, upon lapse of a deposition time period per block for the material A, issues control instructions to close the shutter for the target A and to turn OFF the sputtering power supply for the target A.

Then, after a waiting time X, the control computer 5 engages in executing a sub-process indicated in FIG. 9 as sub-process B like the sub-process A. To wit, it issues control instructions to turn ON the sputtering power supply for the target B and, upon lapse of a deposition time period per block for the material B, issues control instructions to close the shutter for the target B and to turn OFF the sputtering power supply for the target B. Then, after a waiting time Y, the control computer 5 engages in executing a sub-process indicated in FIG. 9 as sub-process C, which again like the sub-processes A and B is omitted from repetitive description.

Next, the control computer 5 moves up the ordinal number of process repetitions from initial 0 to 1 and compares the new ordinal number with a final ordinal number of process repetitions entered in advance. If the new ordinal number is less than the pre-entered final ordinal number of process repetitions, then the control computer 5 re-initiates the process by returning itself to turning ON the sputtering power supply for the target A. Then, the control computer 5 repeats the process consisting of the sub-processes A, B and C and the move-up of the ordinal number of process repetitions. And, when the new ordinal number reaches the preset final ordinal number, the control computer furnishes each of the units with control instructions to terminate its operation. Then, upon receipt of the reports from the respective terminal computers for the units that those instructions are being complied with, the control computer 5 terminates the overall control process.

While in FIG. 9 the overall control process of making a composite oxide thin film is illustrated entailing three different targets, it should be apparent that the process likewise applies to the film making that requires four or more different targets D, E, . . . which may then be added to the flow charge of FIG. 9 to re-program the control process.

Mention is next made of specific examples of the present invention.

EXAMPLE 1

Figure 10:
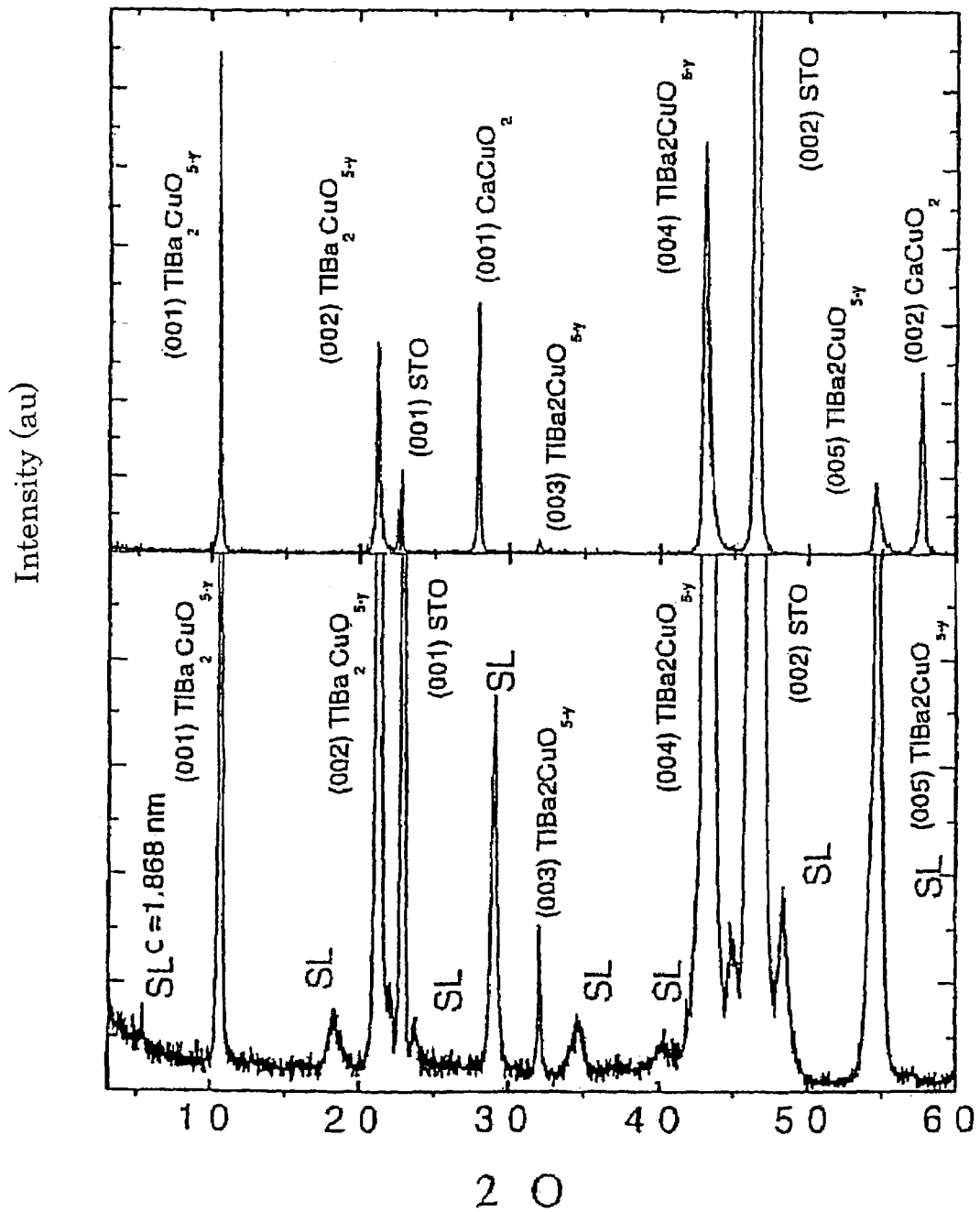
FIG. 10 is a graph illustrating results of X-ray diffraction measurement for a Cu group high temperature superconducting film made by a method and apparatus of the present invention.

FIG. 10 shows results of X-ray diffraction measurement of a Cu group high temperature superconductor thin film made by the method and the apparatus of the present invention.

An oriented substrate of $SrTiO_3$ (100) was formed on it with a deposition block of (Cu, Tl)$Ba_2O_y$ as the charge supply block, which was in turn formed on it with a deposition block of $CaCuO_2$ as the superconducting block. The substrate had a temperature of 430 to 520° C. As is seen from the lower X-ray diffraction diagram in FIG. 10, diffraction peaks of the charge supply block are observed only as those diffraction peaks which correspond to c-face diffractions of $TlBa_2CuO_{5-y}$ crystal. To wit, it is shown that the $TlBa_2CuO_{5-y}$ charge supply block is grown epitaxially as c-axis oriented on the $SrTiO_3$ (100) substrate. Also, as is seen from the upper X-ray diffraction diagram in FIG. 10, diffraction peaks of the superconducting block are observed only as those diffraction peaks which correspond to c-face diffractions of $CaCuO_2$ crystal. To wit, it is shown that the superconducting block of $CaCuO_2$ is grown epitaxially as c-axis oriented on the $TlBa_2CuO_{5-y}$ charge supply block.

The epitaxial growth of a superconducting block of $CaCuO_2$ (a=0.384 nm) on the $SrTiO_3$ (a=0.390 nm) substrate has so far been only possible in a narrow temperature range (430 to 440° C. because of an unacceptable lattice mismatch in the crystallographic a-axis.

In contrast, interposing between the $SrTiO_3$ (a=0.390 nm) substrate and the superconducting block of $CaCuO_2$ (a=0.384 nm) a charge supply block of $TlBa_2CuO_{5-y}$ (a=0.389 nm) designed to serve as a buffer block to reduce the lattice mismatch in accordance with the present invention allows not only the charge supply block but also the superconducting block to be epitaxially grown stably in an expanded temperature range of 430 to 520° C.

EXAMPLE 2

Figure 11:
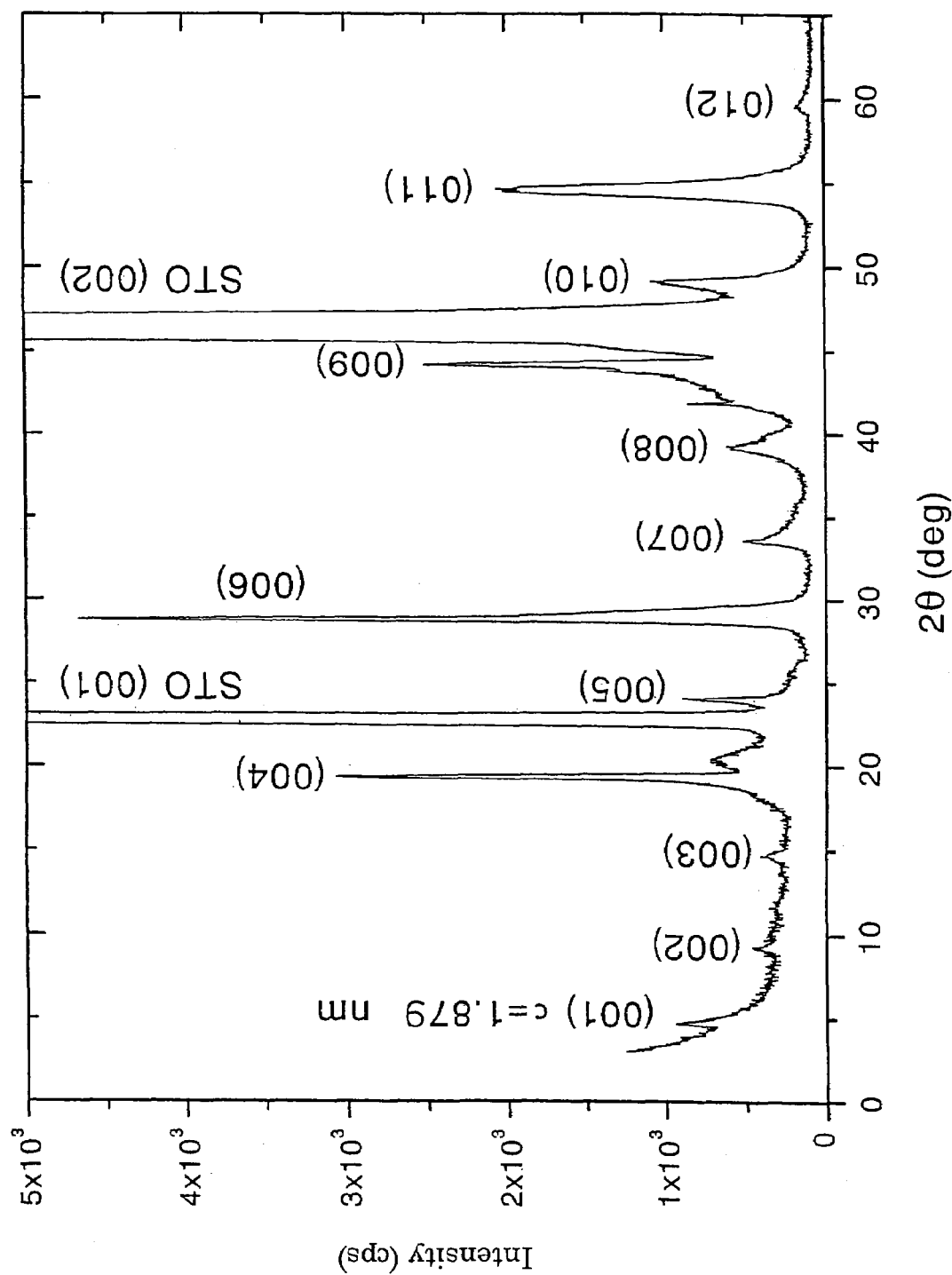
FIG. 11 is a graph illustrating results of X-ray diffraction measurement for a CuTl-1234 high temperature superconducting film made by a method and apparatus of the present invention.

FIG. 11 shows results of X-ray diffraction measurement of a CuTl-1234 high temperature superconductor thin film made using the method and the apparatus of the present invention.

The thin film was made using an oxidizing gas of $N_2O$ and a substrate of STO ($SrTiO_2$) at a substrate temperature of 520° C.

Having, as shown in FIG. 11, an X-ray diffraction pattern comprised of peaks corresponding to those of CuTl-1234 and having a c-axis lattice constant of 1.879 nm, this thin film made is found to be of CuTl-1234 high temperature superconductor. This CuTl-1234 high temperature superconductor thin film has also been found from the measurement of its AC magnetic susceptibility to have a superconducting critical temperature Tc of about 20 K.

EXAMPLE 3

Figure 12:
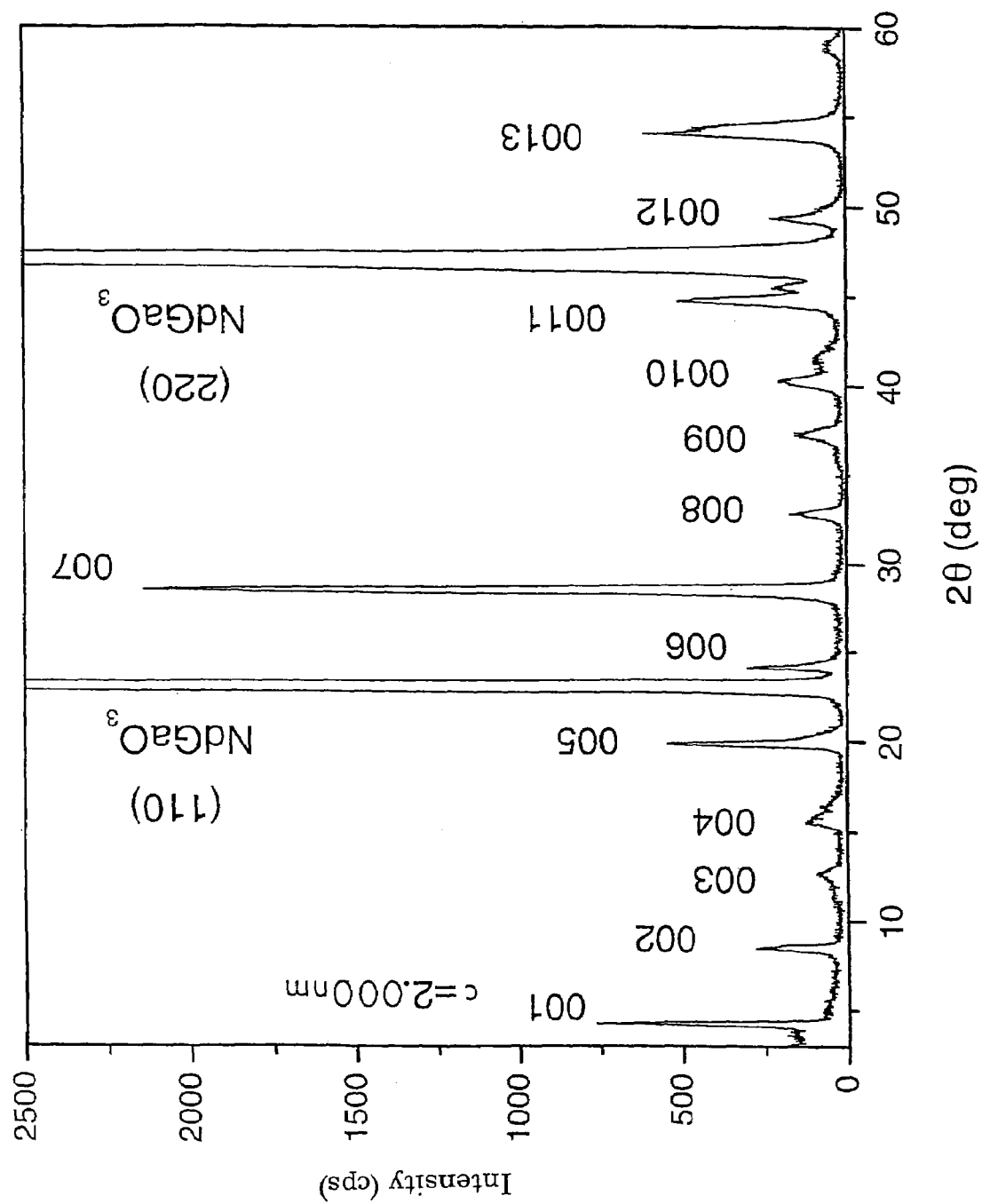
FIG. 12 is a graph illustrating results of X-ray diffraction measurement for a Cu-1245 high temperature superconducting film made by a method and apparatus of the present invention.

FIG. 12 shows results of X-ray diffraction measurement of a CuTl-1245 high temperature superconductor thin film made using the method and the apparatus of the present invention. The thin film was made using an oxidizing atmosphere of $N_2O$ and a $NdGaO_3$ substrate and at a substrate temperature of 520° C.

Having, as shown in FIG. 12, an X-ray diffraction pattern comprised of peaks corresponding to those of CuTl-1245 and having a c-axis lattice constant of 2.0000 nm, this thin film made is found to be of CuTl-1245 high temperature superconductor.

EXAMPLE 4

Figure 13:
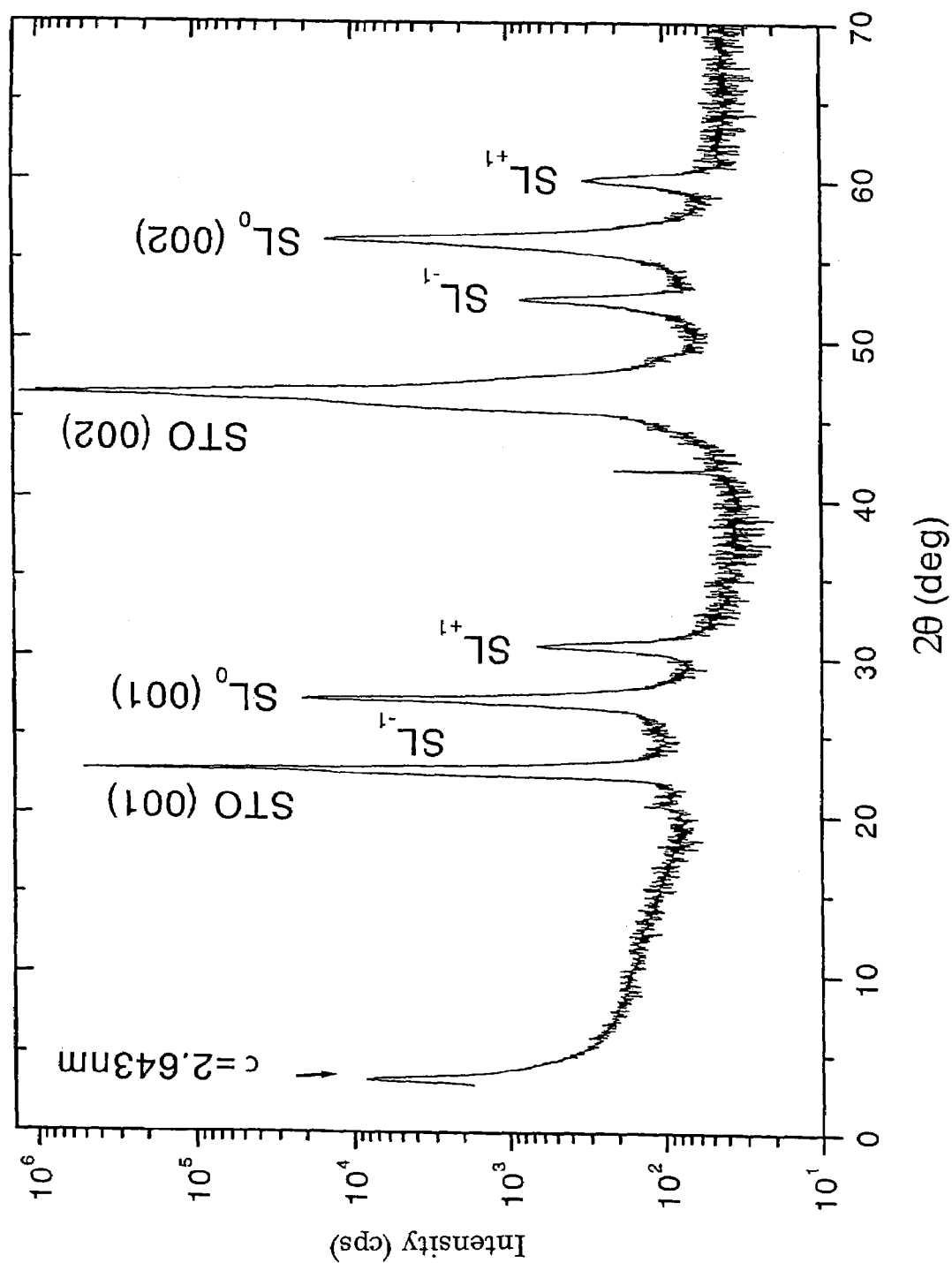
FIG. 13 is a graph illustrating results of X-ray diffraction measurement for a $(CuSrO_2)_m/(CaCuO_2)_n$ (where m=2.5 and n=3-5) high temperature superconducting film made by a method and apparatus of the present invention.

FIG. 13 shows results of X-ray diffraction measurement of a $(CuSrO_2)_m/(CaCuO_2)_n$ (where m=2.5) and n=5.7) high temperature superconductor thin film made using the method and the apparatus of the present invention. The thin film was made using an oxidizing atmosphere of $N_2O$ and a STO ($SrTiO_3$) substrate and at a substrate temperature of 500° C.

Having, as shown in FIG. 13, an X-ray diffraction pattern comprised of peaks corresponding to those of $(CuSrO_2)_m/(CaCuO_2)_n$ (where m=2.5) and n=5.7) group crystalline structure and having a c-axis lattice constant of 2.643 nm, this thin film made is found to be of $(CuSrO_2)_m/(CaCuO_2)_n$ (where m=2.5) and n=5.7) high temperature superconductor.

The high temperature superconductors that can be made in the form of a thin film by the method and apparatus of the present invention are not limited to Cu group high temperature superconductors mentioned above. The Cu group high temperature superconductors listed below can be made very easily in the form of a thin film by the method and apparatus of the present invention as a Cu group high temperature superconductor thin film excellent in superconductivity.

(1) Cu group high temperature superconductors as represented by those having Cu-1223, Cu-1234 and Cu-1245 crystalline structures, and specifically (Cu, M) group high temperature superconductors expressed by chemical formula:

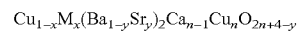

where M represents one or more elements selected from the class which consists of Tl, Bi, Pb, In, Ga, Al, B, Sn, Ge, Si, C, Ti, V, Cr, Mn, Fe, Co, Ni, Zr, Nb, Mo, W, Re, Ru and Os and where $0 \leq x \leq 1.0$, $0 \leq y \leq 1$, $0 \leq z \leq 1, -2 \leq w \leq 4$, and $3 \leq n \leq 15$;

(2) (Cu, M) group high temperature superconductors expressed by chemical formula:

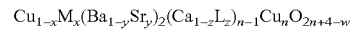

where M represents one or more elements selected from the class which consists of Tl, Bi, Pb, In, Ga, Al, B, Sn, Ge, Si, C, Ti, V, Cr, Mn, Fe, Co, Ni, Zr, Nb, Mo, W, Re, Ru and Os and L represents one or more elements selected from the class which consists of Mg and alkali metal elements and where $0 \leq x \leq 1.0$, $0 \leq y \leq 1$, $0 \leq z \leq 1, -2 \leq w \leq 4$, and $3 \leq n \leq 16$;

(3) (Cu, Tl) group high temperature superconductors expressed by chemical formula:

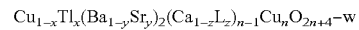

where L represents one or more elements selected from the class which consists of Mg and alkali metal elements and where $0 \leq x \leq 1.0$, $0 \leq y \leq 1$, $0 \leq z \leq 1, -2 \leq w \leq 4$, and $3 \leq n \leq 16$;

(4) (Cu, Tl) group high temperature superconductors expressed by chemical formula:

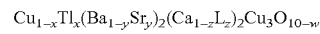

where L represents one or more elements selected from the class which consists of Mg and alkali metal elements and where $0 \leq x \leq 1$, $0 \leq y \leq 1$, $0 \leq z \leq 1$, $-2 \leq w \leq 4$ (5) (Cu, Re) group high temperature superconductors expressed by chemical formula:

$$Cu_{1-x}Re_x(Ba_{1-y}Sr_y)_2(Ca_{1-z}L_z)_{n-1}Cu_nO_{2n+4-w}$$

where L represents one or more elements selected from the class which consists of Mg and alkali metal elements and where $0 \leq x \leq 1$, $0 \leq y \leq 1$, $0 \leq z \leq 1$, $-2 \leq w \leq 4$, and $3 \leq n \leq 16$; and (6) (Cu, M) group high temperature superconductors expressed by chemical formula:

$$Cu_{1-x}M_x(Ba_{1-y}Sr_y)_2(Ca_{1-z}L_z)_{n-1}Cu_nO_{2n+4-w}$$

where M represents one or more elements selected from the class which consists of Ti, V, Cr, B, Si and C and L represents one or more elements selected from the class which consists of Mg and alkali metal elements and where $0 \leq x \leq 1.0$, $0 \leq y \leq 1$, $0 \leq z \leq 1$, $-2 \leq w \leq 4$, and $3 \leq n \leq 16$.

INDUSTRIAL APPLICABILITY

As will be appreciated from the foregoing description, the present invention provides a method and an apparatus which permit making a thin film of composite oxides with satisfactory crystallinity easily and at a low temperature, with the capability of controlling the basic unit cell structure as desired, without necessitating either high temperature or high pressure and without the need for a post annealing, as well as a thin film of composite oxides made thereby, which is extremely useful as used for a ferroelectric material, oxide magnetic material, oxide semiconductor material, nonlinear optical material, insulating material, transparent electrode material, low dielectric material or oxide superconducting material.

What is claimed is:

1. A method of making a thin film of a Cu group high temperature superconductor wherein the superconductor has a basic unit cell comprised of a charge supply block and a superconducting block, comprising:

heating, in a vacuum atmosphere, an oriented crystalline substrate to a surface diffusion temperature;

forming, in said vacuum atmosphere, a buffer layer on said heated substrate by sputtering from a target for the charge supply block in which Cu atoms are partially substituted with atoms capable of bringing about a chemical self-assembling effect; and then introducing an oxidizing gas under a selected pressure into said vacuum atmosphere;

a) forming epitaxially a first block constituting said superconducting block by sputtering from a target for superconducting block until said first block being formed has its thickness determined for said superconducting block in said basic unit cell;

b) forming epitaxially a second block constituting said charge supply block on said first block by sputtering from the target for the charge supply block until said second block being formed has its thickness determined for said charge supply block in said basic unit cell;

repeating steps a) and b) to make a thin film of the Cu high temperature superconductor having a selected thickness on said buffer layer; and then c) forming an insulating layer having a selected film thickness on said formed thin film of Cu high temperature superconductor by sputtering from a third target made of an insulating material; and then repeating steps a) and b) or steps b) and a) to make a thin film of the Cu high temperature superconductor having a selected thickness;

wherein said buffer layer satisfies lattice matching condition for the orientated crystalline substrate and the first block.

2. A Cu group high temperature superconducting thin film making method as set forth in claim 1, wherein said atoms which are substituted for Cu atoms are at least one element selected from the group consisting of Tl, Bi, Pb, In, Ga, Al, B, Sn, Ge, Si, C, Ti, V, Cr, Mn, Fe, Co, Ni, Zr, Nb, Mo, W, Re, Ru and Os.

3. A Cu group high temperature superconducting thin film making method as set forth in claim 1, characterized in that said oxidizing gas is $O_2$, $O_3$, $N_2O$ or $NO_2$.

* * * * *